United States Patent

[11] 3,601,661

[72] Inventor Edward J. Kleinhample, Jr.
Allison Park, Pa.

[21] Appl. No. 7,919
[22] Filed Feb. 2, 1970
[45] Patented Aug. 24, 1971
[73] Assignee Westinghouse Air Brake Company
Swissvale, Pa.

[54] FINNED MODULAR ELECTRICAL EQUIPMENT PACKAGE WITH MOUNTING BRACKET
14 Claims, 5 Drawing Figs.

[52] U.S. Cl. ........ 317/100, 317/120, 325/353
[51] Int. Cl. ........ H05k 7/20, H05k 5/04
[50] Field of Search ........ 165/80; 317/100, 101 CB, 101 DH, 120; 325/352, 353

[56] References Cited

UNITED STATES PATENTS

| | | | |
|---|---|---|---|
| 3,479,568 | 11/1969 | Shapiro | 317/120 |
| 3,364,395 | 1/1968 | Donofrio | 317/100 |
| 3,541,395 | 11/1970 | Lucchino | 317/100 |

*Primary Examiner*—Lewis H. Myers
*Assistant Examiner*—Gerald P. Tolin
*Attorneys*—H. A. Williamson, A. G. Williamson, Jr. and J. B. Sotak

ABSTRACT: This disclosure relates to a modular electrical equipment package having a metallic mounting bracket, a metallic plug-in circuit board case and a metallic U-shaped cover. The metallic case includes a plurality of extending heat radiating fins and is telescopically engageable with the mounting bracket. The metallic case is initially suspended by and thereafter is securely held to the mounting bracket by an elongated retaining screw which is threadedly engaged to the mounting bracket.

INVENTOR
Edward J. Kleinhample Jr.
BY
John B. Sotak

INVENTOR
Edward J. Kleinhample Jr.
BY
John B Sotak

INVENTOR
Edward J. Kleinhample Jr.
BY
John B Sotak

FINNED MODULAR ELECTRICAL EQUIPMENT PACKAGE WITH MOUNTING BRACKET

My invention relates to a modular electrical equipment package and more particularly to a standardized type of detachable housing and bracket assembly for accommodating a variety of plug-in printed circuit boards, for dissipating heat produced by electrical power elements and for providing a mechanical as well as an electrical shield.

With increasing competitive rivalry and rising labor costs, electrical equipment manufacturers have attempted to offset this inflationary spiral by standardizing electrical and electronic components as well as circuits which employ them. One neutralizing agent has been the advent of printed circuits which permit electrical circuits for signal and communication systems to be readily standardized. Presently, the beneficial and economical attributes of standardization are being examined with respect to the mechanical portions of the electrical systems. This extension of uniformity would obviously allow mass production methods to be employed in the manufacturing of the mechanical structures so that tremendous economic savings may be realized. Since standardization also necessitates that optimum or at least penultimate design selections be made, the end product generally will have versatility as well as universality. The versatile aspect of the design enables the standardized structure to readily accommodate a multitude of different types of system circuits and components which may be mounted on the various printed circuit boards. Thus, the printed circuit boards may be quickly changed and replaced during maintenance or repair. The universal aspect of the design allows the standardized structure to be used in a variety of different applications. For example, in railroad applications, the standardized structure should be capable of being shelf, wall and rack mounted since it may be placed either in signal casings along the wayside or in the control room of the operation center. Thus, the advantageous features of standardization relieves many of the problems and troubles which are present in an affluent society.

Accordingly, it is an object of my invention to provide a new and improved electrical equipment package which is of standardized construction.

A further object of my invention is to provide a modular type of metallic electrical equipment package which results in both electrical shielding and mechanical protection.

Another object of my invention is to provide an improved standardized type of detachable housing and mounting bracket assembly.

Yet another object of my invention is to provide a modular electrical equipment package which may be selectively mounted on a shelf, a rack or a wall.

Yet further object of my invention is to provide a modular metallic electrical equipment package which readily dissipates the heat produced by electrical components and which facilely accommodates printed circuit boards or cards.

Still a further object of my invention is to provide a modular package having a metallic case which affords facile insertion and retraction of printed circuit boards, a metallic cover which allows visual inspection of the board-carried components and a metallic mounting bracket which permits quick attachment and detachment of the case to the bracket.

Still another object of my invention is to provide a modular assembly having a printed circuit board housing which is readily clipped to a mounting bracket and is securely held thereto by a retaining screw.

Still yet a further object of my invention is to provide a modular electrical equipment package which is economical in cost, simple to construct, durable in use and reliable in service.

Other features, objects and advantages of my invention will appear as the specification progresses.

In accordance with my invention, the new and improved modular electrical equipment package basically includes a metallic mounting bracket, a metallic case and a metallic cover. The mounting bracket is prefabricated of sheet metal and includes a backplate, a base plate and a pair of sideplates. The backplate extends slightly forward between the base and sideplates and includes a pair of inclined tangs which extend rearwardly from the top of the backplate. A pair of L-shaped mounting legs are formed on the upper and lower side of the backplate for rack or wall mounting installations. A plurality of apertures are formed in the baseplate for shelf mounting installations. A multiple electrical connector and a threaded portion are mounted on the backplate. The metallic case is a boxlike structure and includes a plurality of heat radiating fins formed on at least one exterior surface thereof. The metallic case also includes a plurality of elongated grooves formed on the opposite internal wall for receiving printed circuit boards or cards. A plurality of printed circuit connectors and a matching multiple connector are suitably mounted with the back end of the case. The metallic cover is slid into position and covers the front-end and a portion of each side of the case. When the back end of the metallic case is telescoped over the backplate, the multiple connectors become electrically interconnected while the free ends of the tangs slip over engage the inner edge of a lip formed within the back end of the case. An elongated retaining screw has one end extending beyond the front-end of the metallic case and has the other end capable of being screwed into the threaded portion on the backplate so the case and the bracket are firmly held in proper relationship with each other.

For a more complete understanding of my invention as well as other realizing objects and advantages thereof, reference is made to the following detailed description taken in connection with the accompanying drawings wherein.

Figure 1:
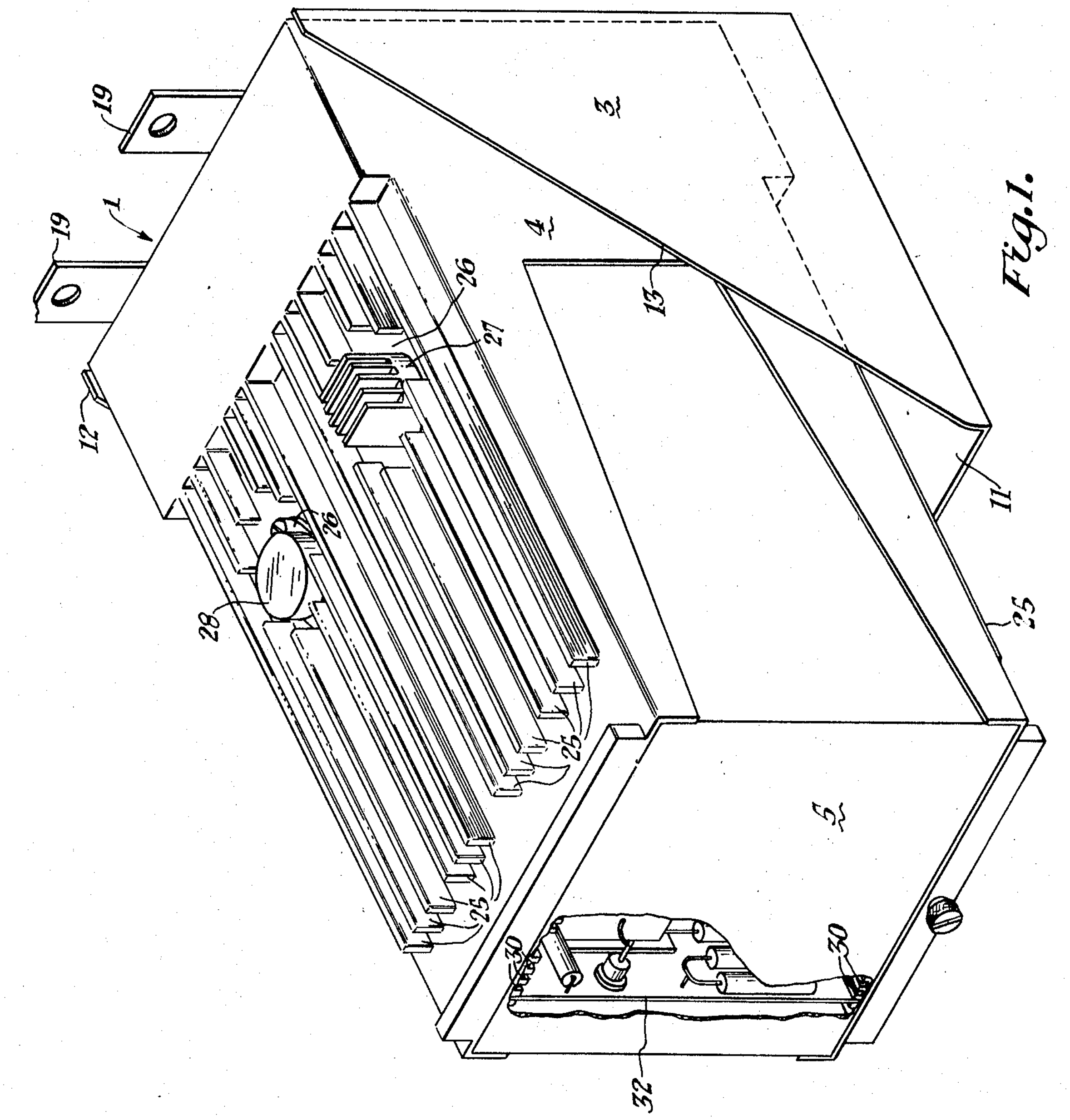
FIG. 1 is a perspective view of the modular electrical equipment package in accordance with the present invention with a portion of the cover removed to illustrate certain details and to facilitate the description thereof.
Figure 2:
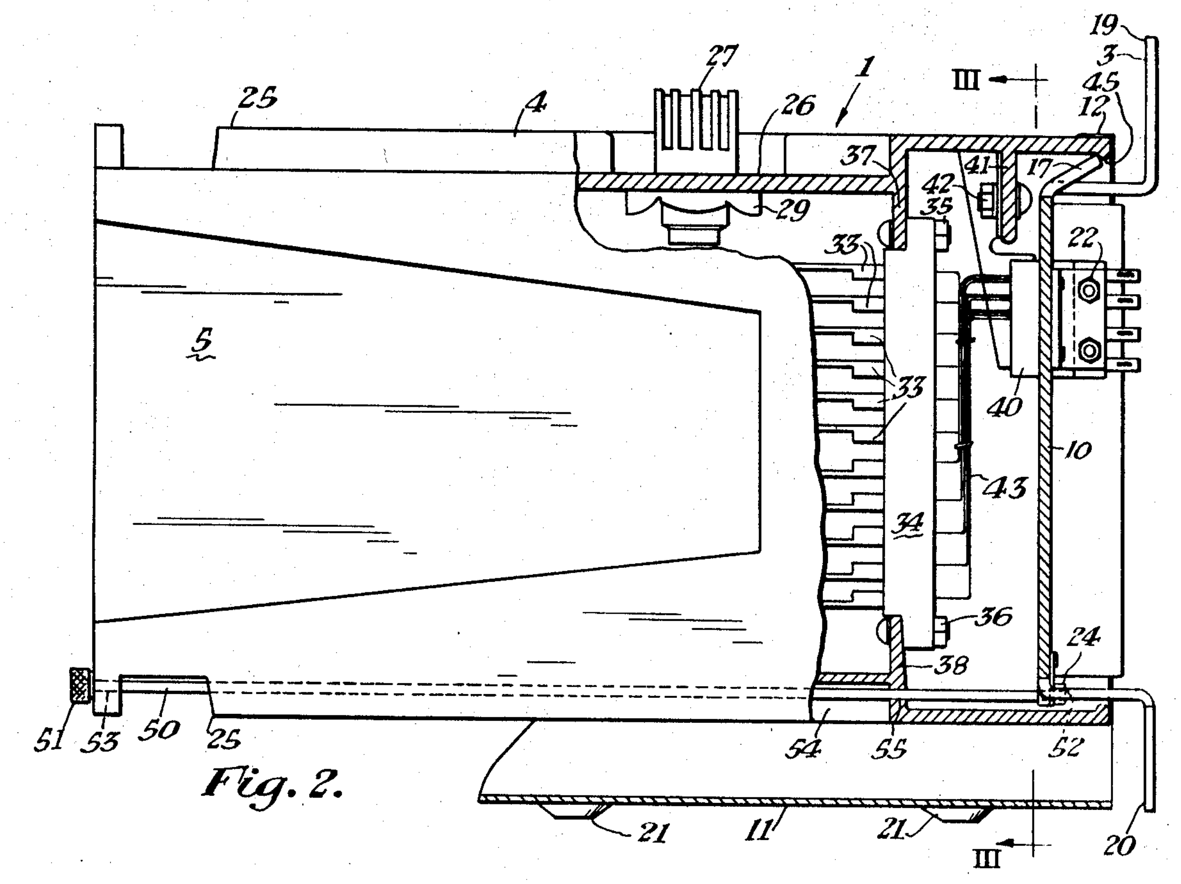
FIG. 2 is a side elevational view of the modular electrical equipment package with part of the metallic case removed to show details of the various internal parts.
Figure 3:
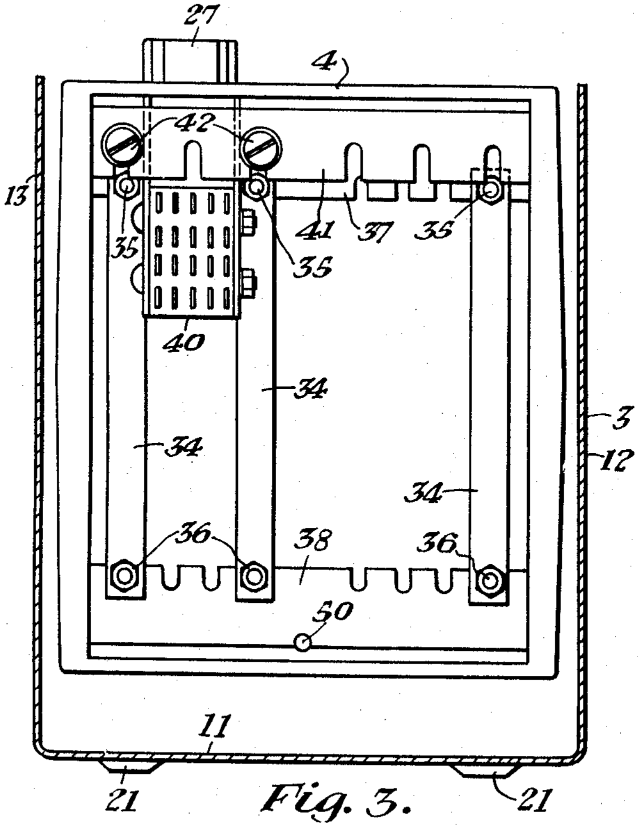
FIG. 3 is a sectional view taken along lines III—III of FIG. 2.

Referring now to the drawings and in particular to FIGS. 1, 2 and 3, the modular electrical equipment package generally characterized by numeral 1 basically consists of a metallic mounting bracket 3, a metallic case 4, and a metallic cover member 5.

Figure 4:
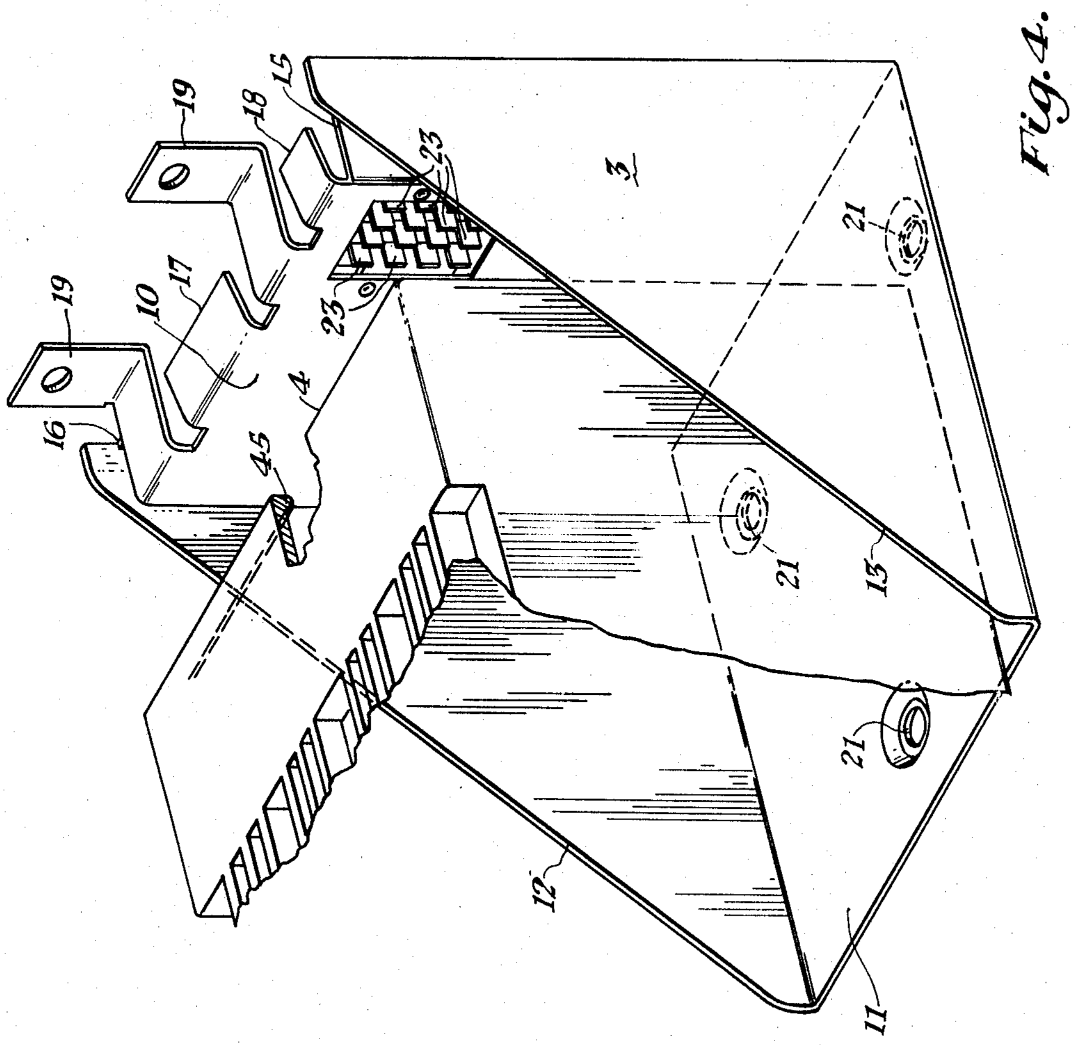
FIG. 4 is a partial exploded perspective view of the rear portion of the case and the mounting bracket of the modular package.

The mounting bracket 3 is prefabricated of sheet aluminum and includes an upstanding backplate 10, a horizontal baseplate 11 and a pair of upright sideplates 12 and 13, respectively. As shown in FIG. 4, the sides of the backplate 10 are bent rearwardly and outwardly as illustrated by characters 15 and 16 so that the frontal face of the backplate extends forwardly into and between the base and sideplates. Thus, the peripheral ends of the outwardly extending portions of the backplate 10 may be suitably secured, such as by welding, to the vertical edges of the two triangular sideplates 12 and 13. Further, in viewing FIGS. 2 and 4, it will be noted that a pair of tangs or tabs 17 and 18 are formed on the top of the backplate 10. As shown, the tangs extend rearwardly and are slightly upward, the purpose of which will be described presently. Further, it will be seen that a pair of L-shaped supporting legs 19 extend from the top of the backplate and a pair of L-shaped supporting legs 20 extend from the bottom of the backplate 10. As shown, the supporting legs 19 and 20 are integrally formed from the backplate, but it is understood that separate L-shaped or angular material or the like may be equally well employed by simply securing the plate 10 by welding thereto. The legs 19 and 20 permit the plate 10 to be mounted directly to a wall in the control station or to be mounted on a rack within an equipment cabinet which is commonly provided in signal or communication installations. However, in some cases where it is desired to shelf mount the package, the bracket 3 may be secured to the shelf by bolts or screws which pass through the dimpled mounting holes 21 stamped or punched in the base portion 11 of the bracket 3 for such installations. As shown in FIGS. 2 and 4, a multiple electrical connector, such as, a plug portion 23 is carried by the backplate 10. The plug connector is suitably attached to the backplate by rivets or the like and includes a plurality of prongs 23 slightly projecting toward the front surface of the backplate. The rearwardly extending terminal portions of prongs 23 are suitably connected, such as soldered, to electrical wires or leads (not shown) interconnecting the other apparatus of the system. In viewing FIGS. 2 and 5, it will be noted that a threaded boss or nut 24 is preferably riveted to the lower central portion of backplate 10. The boss 24 projects rearwardly from the plate 10 and a suitable aperture is formed in the backplate 10 as will be described in greater detail hereinafter.

Figure 5:
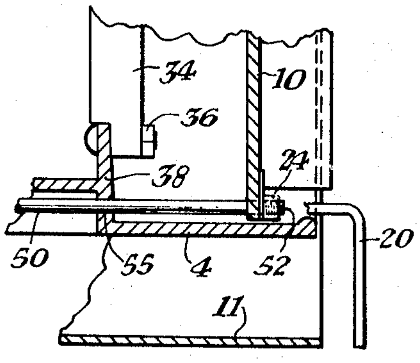
FIG. 5 is a slightly enlarged broken sectional view illustrating the lower back end of the package.

The case 4 is preferably formed of suitable metal, such as cast aluminum, and takes the form of a boxlike structure with its front-end and a elements. For of its sides remaining open to permit insertion and visual inspection of printed circuit boards or cards which will be described presently. As shown, both the upper and the lower exterior surfaces of the aluminum case 4 are provided with a plurality of outwardly projecting elongated ribs or fins 25. Thus, the fins 25 furnish a large radiating surface area to the surrounding ambient air. Further, it will be noted that some of the heat radiating ribs are interrupted at various locations to provide component mounting areas or pads 26 for different types of heat producing electrical elements. For example, as shown in FIGS. 1 and 5, a stud-type mounted power resistor 27 is thermally secured to one of the top mounting pads 26 by nut 29. Similarly, a header-type mount power transistor 28 is thermally secured to the other mounting pad 26 by suitable fasteners, such as, screws (not characterized). Thus, the thermal energy generated by the heat producing elements is effectively and efficiently dissipated to the ambient surrounding. It will be appreciated that the bottom ribbed surface is also provided with one or more mounted areas for other heat producing elements.

In viewing FIG. 1, it will be noted that the case 4 is also provided with a plurality of elongated grooves or slots 30 formed in the upper and lower internal surfaces thereof. The grooves or slots 30 may extend substantially the length of the case 4, or may be made up of several portions along the length of the case 4, and it will be appreciated that as the number of slots selected increases so does the versatility of the module 1 expand due to its ability to accommodate a greater number as well as different types of boards. Thus, printed circuit boards and cards, such as board 32, carrying the various electrical and electronic components which make up the various signal and communication circuits are simply inserted into slots 30 in random fashion. The boards are then pushed into position to a point where the terminal portions 33 intimately engage and electrically contact the strip connector 34 as shown in FIG. 2. It will be perceived that the number of printed circuit boards accommodated by the case 4 is necessarily limited by the size of the components carried by the various printed circuit boards. Generally, a module would hold a lesser number of boards having relatively large transformers or the like than those having relatively small component like transistors. Thus, the printed circuit boards or cards may be readily inserted and replaced with minimum time and effort. As shown, the strip connector 34 is suitably secured to the inside of case 4 by means of nuts and bolts 35 and 36 which pass through selected apertures in upper and lower depending flanges 37 and 38. As shown, the strip connector 34 is factory-wired through wiring harness 43 to a multiple socket connector 40 which is securely fastened by nuts and bolts 42 to a depending web portion 41. The socket 40 is the matching connector for the plug connector 23. The back end of the metallic case 4 beyond flange 41 extends beyond flange 41 so that a recess or hollow portion is formed therein, the purpose of which will be described presently.

In viewing FIGS. 2 and 4, it will be noted that a rounded lip or boss 45 is formed on the underside near the end of the upper wall of the recess portion of case 4. As shown, the lip 45 extends the width of case 4 and is employed for holding or suspending the case to the mounting bracket 3. That is, the free ends of the tabs or tangs 17 and 18 engage the inner edge of the lip 45 thereby holding the metallic case 4 in hanging relation with the mounting bracket 3. Now, a retaining screw 50 having a knurled slotted head portion 51 on one end and a threaded portion 52 on the other end is employed for securely fastening the metallic case in relative position to the mounting bracket 3. As shown, the retaining screw 50 is adapted to pass through a passageway formed by aperture 53 in the front face of case 4, a channel 54 formed between the two central heat radiating fins 25 and an aperture 55 in flange 38. After insertion, the retaining screw 50 is turned manually or by inserting a screwdriver in the slot of head portion 51. The turning action causes the threaded portion 52 to enter the internal threads of member 24. The screw is turned until tight to thereby securely hold the case 4 against the outwardly extending side portions 15 and 16 of bracket 3.

As shown, the U-shaped aluminum dust cover 5 is employed for suitably enclosing the front and side portions of the metallic case 4. The cover member 5 is simply slid into position from the front of case 4. Generally, special cover fasteners are unnecessary since sufficient frictional resistance exists between the flanks of the cover 5 and the sides of the case 4 to retain the cover in place.

When it is desired to remove the entire housing, namely, case 4 and cover 5 from the mounting bracket 3, it is simply necessary to unscrew the retaining screw 50, and thereafter simply lift the case 4 upwardly by its front until the free ends of the tangs 17 and 18 have cleared the inner edge of boss 45 and thereafter pull the module forward as shown in FIG. 4. Thus, the module and its circuitry may be readily removed and replaced with minimum time and effort.

Further, it will be appreciated that during periodic maintenance and inspection, it is simply necessary to remove the cover 5. The removal of the U-shaped cover exposes both the front and the sides of the printed circuit boards 32 thereby maximizing visual inspection and allowing various tests to be performed while the printed circuit boards are actively connected in the system.

The aluminum case cover and bracket provide not only mechanical protection for the internal components but also shields the circuitry from electrical interferences which might be present in the surrounding area.

The large number of heat radiating fins and the superior thermal conductivity of aluminum maximizes the heat dissipating characteristics and reduces the possibility of heat damage to the various electrical components.

The printed circuit board connector and the multiple plug and socket connector allows quick connection and disconnection which is a highly advantageous feature in maintenance and replacement of electrical circuits.

In actual practice, the modular electrical equipment package has been designed to accommodate 5×8½-inch printed circuit boards, however, it is understood that other sizes of boards and other equipment cards may be utilized in practicing my invention.

My invention has high practicability in a high frequency highway crossing detection arrangement in which the transmitter is housed within one package unit and the receiver is housed in another package unit. As previously mentioned, the aluminum packages provide RF isolation between the transmitter and receiver without the need of special shielding.

It will be appreciated that various deviations of size and configurations and dimensions are well within the purview of my invention.

Similarly, although I have herein illustrated and described only one form of the apparatus embodying may invention, it is understood that various changes and modifications may be made therein within the spirit and scope of the appended claims without departing from the sphere of my invention.

Therefore, the foregoing detailed description has been given for clearness of understanding only and no unnecessary limitations should be placed on the appended claims but they should be construed as broadly as permissible in the light of the prior art.

Having thus described my invention, what I claim is:

1. A modular package for electrical equipment comprising, a mounting bracket, a metallic case having its back end telescopically engaged with and removable from said mounting bracket, a U-shaped cover enclosing the front end and a portion of the sides of said metallic case, and an elongated retaining screw having one end extending beyond the front end of said metallic case and having the other end threadedly engaging said mounting bracket for securely holding said case in position.

2. A modular package as defined in claim 1, wherein said mounting bracket is prefabricated of sheet metal and includes a backplate, a baseplate and a pair of sideplates.

3. A modular package as defined in claim 2, wherein said backplate projects forward between said base and sideplates and includes a pair of tangs extending slightly upward and backward between said base and sideplates.

4. A modular package as defined in claim 3, wherein said metallic case includes a recessed back end and a lip which engages the free ends of said pair of tangs when said metallic case is telescoped over said projected backplate.

5. A modular package as defined in claim 1, wherein said metallic case has at least one exterior surface provided with fins for dissipating the heat produced by the electrical equipment.

6. A modular package as defined in claim 1, wherein a plurality of grooves are formed inside of said metallic case so that printed circuit boards are insertable into and removable from said metallic case.

7. A modular package as defined in claim 1, wherein said U-shaped cover is slid into place with said metallic case.

8. A modular package as defined in claim 1, wherein a multiple electrical connector is mounted on said backplate of said mounting bracket and a matching multiple electrical connector is positioned within said recessed back end of said metallic case.

9. A modular package as defined in claim 5, wherein component mounting pads are formed between the fins on said one exterior surface.

10. A modular package as defined in claim 1, wherein said metallic case is a boxlike structure having heat dissipating fins formed on the upper and lower exterior surfaces and having component carrying card grooves formed on the upper and lower internal surfaces.

11. A modular package as defined in claim 2, wherein said backplate includes a plurality of apertured angular mounting legs and said baseplate includes a plurality of mounting holes.

12. A modular package as defined in claim 1, wherein said metallic case includes a plurality of elongated internal grooves and a plurality of electrical connectors for accommodating a plurality of printed circuit boards.

13. A modular electrical equipment package comprising a mounting bracket constructed of a back portion, a base portion and a pair of side portions, said back portion having a pair of slightly inclined laterally extending tabs and a threaded aperture, a boxlike metallic case having at least one exterior surface provided with heat radiating fins and having a plurality of internal elongated grooves for accommodating printed circuit boards, said boxlike metallic case having a portion of both sides and front protected by a slidably removable cover, said boxlike metallic case having a passageway extending from front to back and having a lip formed near the back thereof which engages the free ends of said pair of laterally extending tabs, and an elongated retaining screw extending along said passageway of said boxlike metallic case and threadedly engaging said threaded aperture for securely holding said boxlike metallic case in proper relationship with said boxlike metallic case in proper relationship with said mounting bracket.

14. A modular electrical equipment package as defined in claim 13, wherein said mounting bracket, said boxlike metallic case and removable cover are constructed of aluminum to provide electrical shielding as well as to afford mechanical protection.